United States Patent [19]
Chen et al.

[11] Patent Number: 5,550,854
[45] Date of Patent: Aug. 27, 1996

[54] BINARY STRATIFIED STRUCTURES FOR PERIODICALLY PUMPED SEMICONDUCTOR LASERS

[75] Inventors: Howard Z. Chen, Berkeley Heights; Alfred Y. Cho, Summit, both of N.J.

[73] Assignee: Lucent Technologies Inc., Murray Hill, N.J.

[21] Appl. No.: 346,051

[22] Filed: Nov. 29, 1994

[51] Int. Cl.$^6$ .................................................. H01S 3/19
[52] U.S. Cl. .................................................. 372/45; 372/43
[58] Field of Search .................................. 372/45, 43, 46

[56] References Cited

U.S. PATENT DOCUMENTS

| | | | |
|---|---|---|---|
| 4,890,293 | 12/1989 | Taneya et al. | 372/46 |
| 5,075,743 | 12/1991 | Behfar-Rad | 372/45 |
| 5,212,707 | 5/1993 | Heidel et al. | 372/50 |

*Primary Examiner*—Rodney B. Bovernick
*Assistant Examiner*—Yisun Song

[57] ABSTRACT

A laser having a binary stratified structure of alternating sections of graded-index, separate confinement heterostructure (GRINSCH) and semi-insulating semiconductor formed in the direction of light propagation. The active region of the laser includes at least two GRINSCH sections upon a substrate and at least three filler sections sandwiching the at least two GRINSCH sections in an alternating fashion. An analysis of the practical limit on the minimum threshold current and the packaging problems of a semiconductor laser based on the binary stratified structure is included.

6 Claims, 9 Drawing Sheets

BINARY STRATIFIED STRUCTURES FOR PERIODICALLY PUMPED SEMICONDUCTOR LASERS

BACKGROUND OF THE INVENTION

1. Field of the Invention

The invention relates to semiconductor lasers, and more specifically to a graded-index, separate confinement heterostructure (GRINSCH) laser.

2. Related Art

Periodically stratified structures are known to have applications as bandpass filters and reflectors in optics, and in practice, they are relatively simple to make and easy to analyze. (See Born and Wolf, *Principles of Optics*, Pergamon Press, N.Y. (1959) and van der Ziel and Ilegems, *Applied Optics*, 14(11):2627 (1975).) In a typical semiconductor laser, however, light propagates in the direction parallel to the epitaxial layers. For example, FIG. 1 shows a conventional semiconductor laser 100 having a continuous active channel region 102. As a result, photonic devices such as a distributed feedback laser, which could have been designed to function based on a normal incidence of light on a periodically layered structure, have not been studied extensively.

Recently, however, advances in areas of semiconductor in situ processing (see Harriot et al., *J. Vac. Sci. Technol. B*, 8(6) (1990)), and in reactive ion etching (see Giapis et al., *Appl. Phys. Lett.* 57(10):983 (1990), Scherer et al., *J. Vac. Sci. Technol. B*, 8(1):28 (1990) and Scherer and Craighead, *J. Appl. Phys.* 49:1284 (1986)), have made possible the fabrication of microstructures with a surface area as small as 100Å×100Å (see Rondall et al., *J. Vac. Sci. Technol. B.*, 8(6) (1990)). Crystal regrowth techniques, on the other hand, have matured to the point that high quality, lattice matched semi-insulating material can be grown routinely. These two major factors, plus the availability of reliable, low cost, and high performance flip-chip solder reflow packaging techniques used in multichip modules (see K. L. Tai, Proceedings of *Multichip Module Workshop*, IEEE Computer Society, Santa Cruz, Calif. (1991)), demand a re-examination of the role of periodically stratified structures, for photonic device applications.

Given the many advantages a low threshold current offers in a semiconductor laser, there has been a fervent search for the lowest threshold semiconductor laser. The efforts in crystal growth, especially by MBE (molecular beam epitaxy), have resulted in the successful demonstration of sub-100 A/cm² threshold current density SQW (single quantum well) GRINSCH lasers materials. (See Chen et al., *Appl. Phys. Lett.* 51:2094 (1987) and *Electron. Lett.* 1334 (1987) and Chand et al., *Appl. Phys. Lett.* 58:1704 (1991).) Meanwhile, the efforts in mass-etching, crystal regrowth, and mirror-coating lave produced sub-mA (milli-amps) threshold current lasers using SQW GRINSCH structures. (See Derry et al., *Appl. Phys. Lett.* 50:1773 (1987).)

Despite their significant success, SQW GRINSCH lasers have left much room for improvement. First, the use of a full-cavity length GRIN (graded refractive index) waveguide is overkill for achieving stable, low loss optical oscillation. Second, the reduction of threshold current, which has been mainly due to the reduction of the active volume in both x and y direction (see FIG. 1), is incomplete. Although the use of MBH has enabled the reduction of the active volume of a laser in the x direction, to the quantum limit of several monolayers, and the techniques of mesa-etching and crystal regrowth have reduced the active volume in the y direction to less than 1 μm, the active volume in the z direction along the laser cavity has stayed at the current level of more than 250 μm. What is desired is a semiconductor laser that has minimized threshold current and a reduction of the active volume in the z direction along the laser cavity.

SUMMARY OF THE INVENTION

The present invention provides confinement of the active volume in the z-direction of a semiconductor laser (i.e., the optical propagation direction) by fashioning the active region into a mesa. Periodically pumped structures are made by forming multiple mesas separated by high-bandgap "filling" layers to form a binary stratified structure.

The preferred embodiment is a graded-index, separate confinement heterostructure laser, comprising a substrate and a binary stratified structure upon the substrate. The binary stratified structure comprises an active region of the laser. The active region include at least two graded-index, separate confinement heterostructure (GRINSCH) sections upon the substrate and at least three filler sections upon the substrate and sandwiching the at least two GRINSCH sections in an alternating fashion.

Distributed feedback is optionally provided by a relatively large multiplicity of mesas specially spaced to satisfy the Bragg condition.

DETAILED DESCRIPTION OF THE PREFERRED EMBODIMENT

I. Introduction

Figure 1:
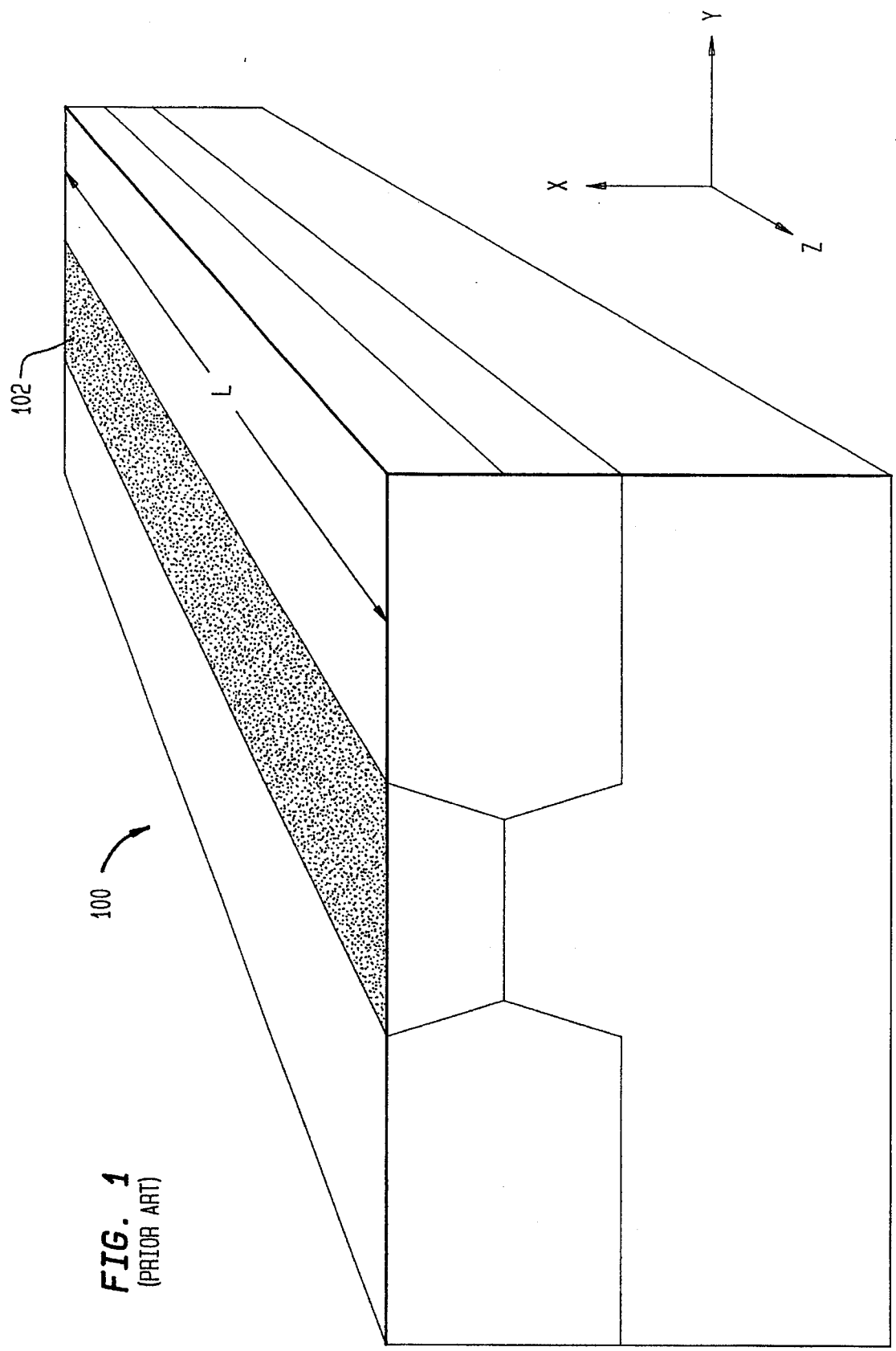
FIG. 1 shows a conventional semiconductor laser 100 having a continuous active channel region 102.

The preferred embodiment of the invention is discussed in detail below. While specific steps, configurations and arrangements are discussed, it should be understood that this is done for illustrative purposes only. A person skilled in the relevant art will recognize that other steps, configurations and arrangements can be used without departing from the spirit and scope of the invention.

The preferred embodiment of the invention is now described with reference to the figures where like reference numbers indicate identical or functionally similar elements. Also in the figures, the left most digit of each reference number corresponds to the figure in which the reference number is first used.

Further background material concerning semiconductor solid state physics can be found in a number of references, including two books by S. M. Sze, titled: *Physics of Semiconductor Devices*, John Wiley & Sons, Inc., N.Y., (1981), and *Semiconductor Devices, Physics and Technology*, John Wiley & Sons, Inc., N.Y., (1985), both of which are incorporated herein by reference.

The preferred embodiment of the invention is directed to a mesa comprising binary stratified quantum well structures formed by alternating sections of active GRINSCH (graded refractive index separate confinement heterostructure) laser structure and a low loss, high bandgap semi-insulating semiconductor. However, the present invention is not limited to this specific structure.

The effect of the reduced total active volume on such important device parameters as the threshold current $I_{th}$, optical beam size w, critical current density $j_{migration}$ that causes metal migration, and heat removal rate $H_{sink}$ associated with packaging will be addressed. The advantages for potential mode-locking or other dynamic behaviors made possible by the binary stratified structure will be pointed out. Finally, the application of such a binary stratified structure for distributed feedback lasers will be addressed. The main focus of the invention is how to use existing materials growth and device processing technology to build manufacturable and reliable minimum threshold lasers and distributed feedback lasers.

II. Minimization of Active Volume

With the introduction of a binary stratified structure of the present invention, the inventors have further reduced this last dimension (z) of the active volume to achieve the lowest threshold current laser to date. A discussion of what happens if the active volume is further reduced in the direction along the laser cavity, what limits this reduction in practice, and how to build a minimum threshold laser (MTL) with existing materials growth and device processing technology according to the invention, is preceded by a discussion of the GRINSCH laser.

The major advantage of a GRINSCH laser over a homojunction laser, as demonstrated by a drastic reduction in threshold current density from over 10 kA/cm² to as low as 50 A/cm², is in the control of the optical beam parameter in the resonator, and in the reduction of total active volume. In the first case, the beam spot size of a homojunction which is theoretically infinite, is reduced to the scale about one wavelength in a SQW GRINSCH laser. This results in very low diffraction loss at the mirror. In the second case, the total volume of active medium is reduced by a factor approximately equal to the ratio of diffusion length to the quantum well thickness (a factor of about 100).

Since the total threshold current, $I_{th}$, is equal to the sum of a transparency current, $I_{trans}$, which is proportional to the total volume of the active medium, and a gain current, $I_{gain}$, which is equal to the extra amount of pumping required to overcome cavity loss, and is a constant for a given cavity, minimizing the threshold current is equivalent to minimizing the active volume $V_{act}$. The importance of active volume was long realized even before the invention of quantum well lasers. For example, the transparency current density given by Thompson, prior to the invention of quantum well lasers, is $j_{trans}$=4,000 A/cm²×$l_x$ (μm), for GaAs (gallium arsenic), where $l_x$ is the thickness of the active layer in x direction. (See G. H. B. Thompson, *Physics of Semiconductor Laser Devices*, Wiley, N.Y. (1980).) This simple expression for $J_{trans}$ if scaled down to the two-dimensional quantum well limit with $l_x$=0.01 μm, gives 40 A/cm², which is in excellent agreement with the latest results on low threshold current density in SQW GRINSCH GaAs/AlGaAs (aluminum gallium arsenic) lasers. (See Chen et al., *Appl. Phys. Lett.* 51:2094 (1987) and *Electron. Lett.* 1334 (1987) and Chand et al., *Appl. Phys. Lett.* 58:1704 (1991).) Clearly, the reduction of threshold current from a bulk homojunction laser to a quantum well laser, at least in the first order, is entirely due to the reduction of the active volume.

The obvious advantage in a small active volume has been partially achieved by the combined effort to reduce $V_{act}$ in x direction by thin-film epitaxial growth techniques (such as MBE), and in the y direction by regrowth of a high bandgap, semi-insulating material. The effort to reduce $V_{act}$ in the z direction has been missing, partly due to the lack of understanding of how it would affect the laser performance, and mainly, due to the difficulty in materials processing and device fabrication. For example, only in recent years have artisans been able to use reactive ion etching (RIE) or electron cyclotron resonance (ECR) techniques to fabricate sub-micron vertical means. (See Giapis et al., *Appl. Phys. Lett.* 57(10):983 (1990), Scherer et al., *J. Vac. Sci. Technol. B*, 8(1):28 (1990) and Scherer and Craighead, *J. Appt. Phys.* 49:1284 (1986).) The crystal regrowth, on the other hand, has not been easy because of a stringent requirement for initial surface preparation. (See Di Choquette et al., *Appl. Phys. Lett.* 60:1738 (1992).) These two necessary techniques, fortunately, are now at a more mature stage, allowing the exploration of the ultimate limit in low threshold current.

To build an MTL, the requirement for (1) stable, low loss optical oscillation, and for (2) minimum active volume have to be optimized simultaneously. Although a full-cavity length GRIN is good, it is not necessary. Since total active volume has been reduced in 2 dimensions, it can be further reduced in the third dimension, according to the present invention. The following shows how these two requirements, along with other important practical considerations, can be simultaneously considered to achieve the practical limit of threshold current.

Figure 2:
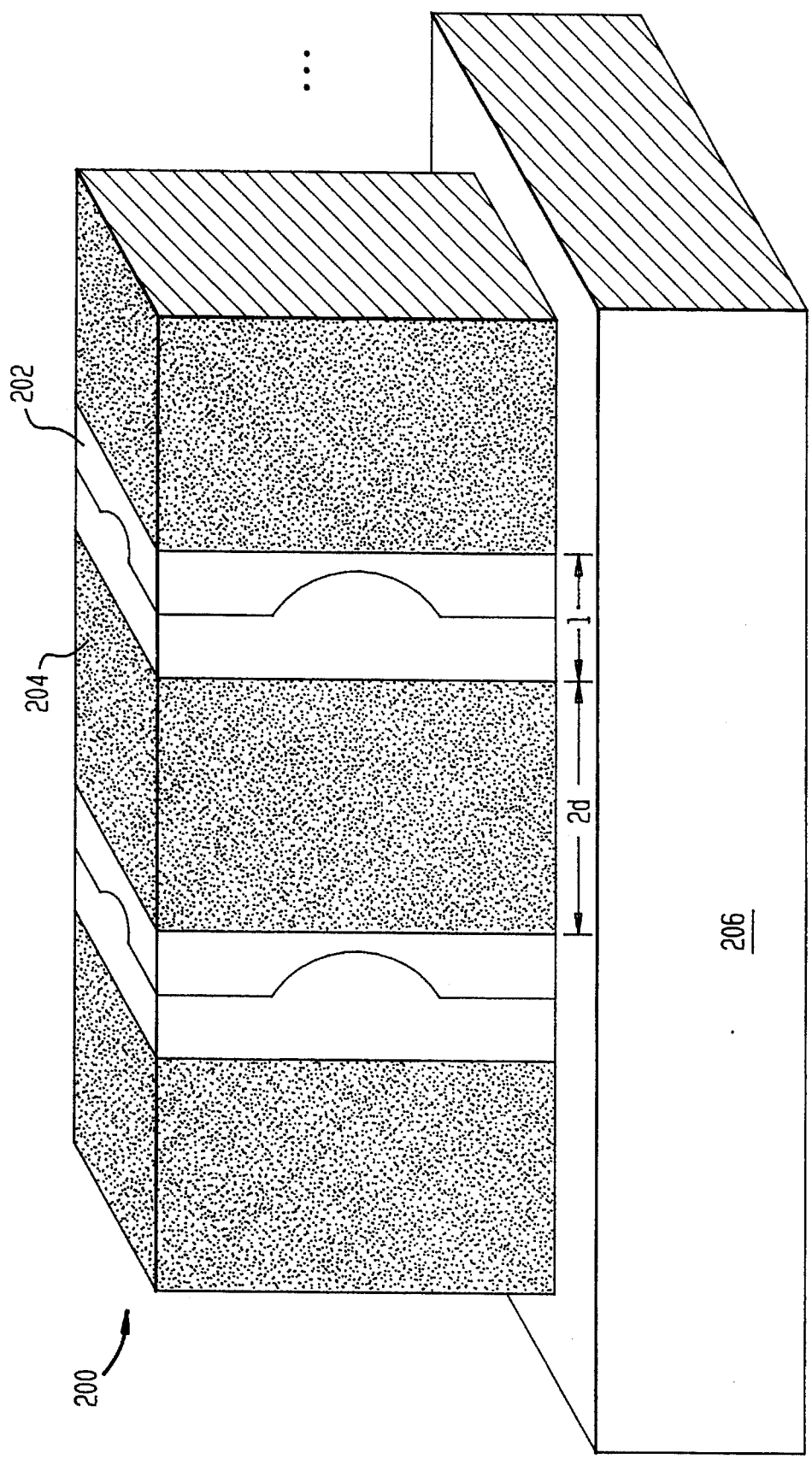
FIG. 2 shows a binary stratified structure formed with alternating sections of GRINSCH laser structure and low loss semi-insulating semiconductor according to the present invention.

According to the preferred embodiment of present invention, a general device structure comprises binary stratified section 200 having GRINSCH section 202 and filling sections 204 formed on a substrate 206, as shown in FIG. 2. The ray matrix of the GRINSCH is $M_{GRIN}$, and the ray matrix of the insulator is $M_{fill}$. A Gaussian beam is assumed.

Figure 3:
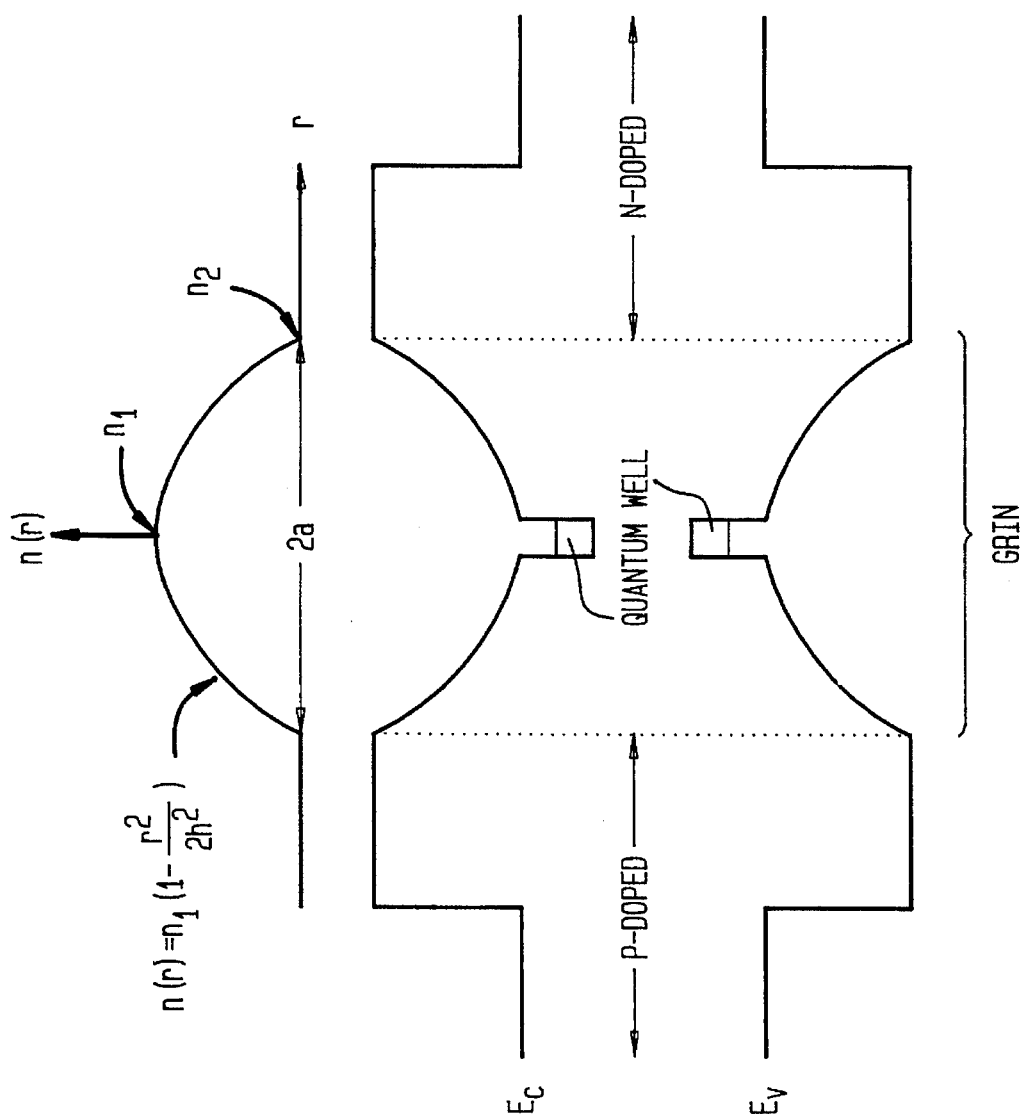
FIG. 3 shows an energy band diagram profile for the active material of the GRINSCH in FIG. 2 with refractive index, n(r), and band edges, $E_c$, and $E_v$, according to the present invention.

This discussion covers, but is not limited to, the case where the GRIN is made from a quadratic refractive index waveguide, with a well-known ray matrix. An energy band diagram of a active material made from a length of GRINSCH of the laser in FIG. 2 is shown in FIG. 3. The refractive index is n(r), and the conduction and valence band edges and $E_c$, and $E_v$, respectively.

Figure 4:
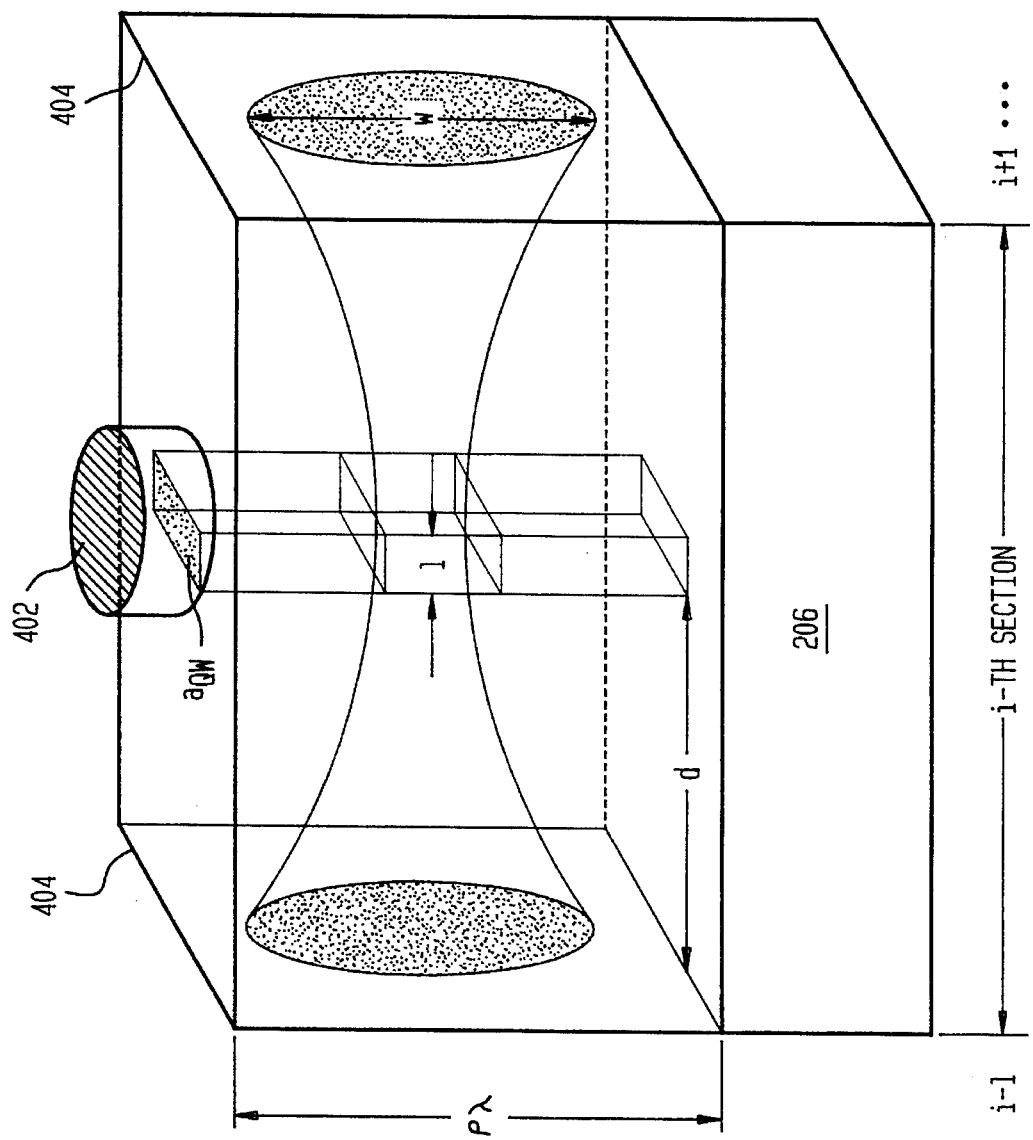
FIG. 4 shows a single cell of an MTL/DFB laser according to the present invention, with N such cells in a MTL/DFB laser, and $A_{Qw}=N\alpha_{Qw}$.
Figure 8:
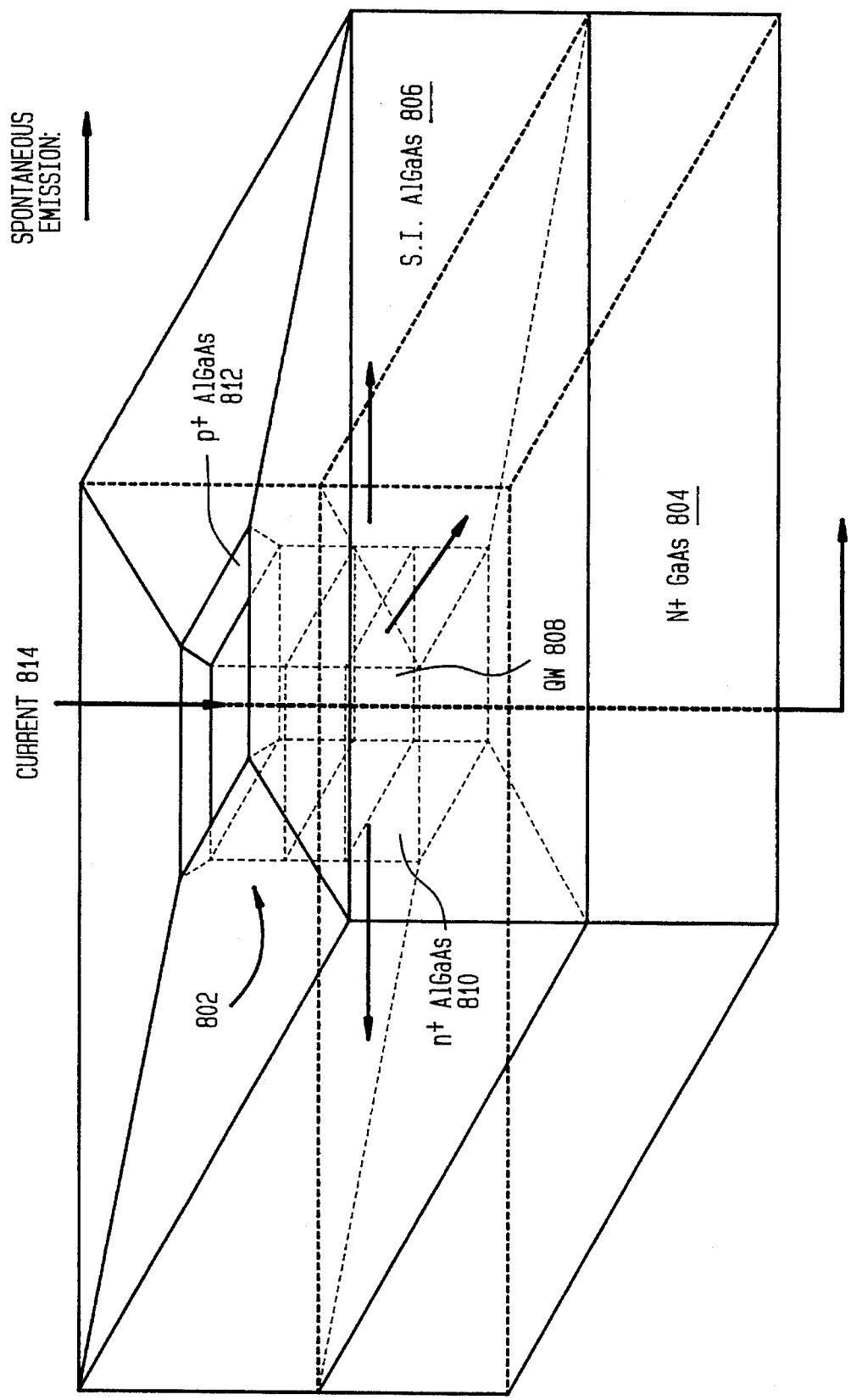
FIG. 8 shows the isotropic spontaneous emission from a single active mesa, according to the present invention.

The effect of a single GRIN section (in practice, there are many) is shown in FIG. 4 inside a cavity, and in FIG. 8. Also shown in FIG. 4 is a solder bump 402 that acts both as an electrical, as well as a thermal interface to the outside world. The total cavity length is L (see FIG. 1) the active length is l, and the transparent material length 2d+l represents the length between reference planes 404 for spot size.

FIG. 8 shows the isotropic spontaneous emission (see legend) from a single active mesa 802 formed on a n⁺ doped GaAs substrate 804 and surrounded by semi-insulating AlGaAs filler 806. The quantum well (QW, 808) is located between n$^+$ doped AlGaAs (810) and p$^+$ doped AlGaAs (812). The active region is current pumped, as shown at 814.

III. Resonator Stability

It should be noted that only in the x direction can a true GRIN structure be obtained. In the y direction is an approximate GRIN resulting from a step index waveguide formed by crystal regrowth. For this discussion, the inventors have used a simplified GRIN section with circular symmetry to approximate a realistic GRIN waveguide. Using the standard ray tracing matrix method, we obtain for the resonator shown in FIG. 4. (See Born and Wolf, *Principles of Optics*, Pergamon Press, N.Y. (1959) and Giapis et al., *Appl. Phys. Lett.* 57(10):983 (1990).) The round-trip ray-matrix assuming a single GRIN section (the results here apply to the general case shown in FIG. 2) is as follows:

$$\begin{bmatrix} A & B \\ C & D \end{bmatrix} = M = M_{fill} \times M_{GRIN} \times M_{fill} \times M_{fill} \times M_{GRIN} \times M_{fill}, \quad (1)$$

where $M_{fill}$, $M_{GRIN}$ are:

$$M_{fill} = \begin{bmatrix} 1 & d/n \\ 0 & 1 \end{bmatrix}, M_{GRIN} = \begin{bmatrix} \cos(l/h) & h/n_1 \sin(l/h) \\ -n_1/h \sin(l/h) & \cos(l/h) \end{bmatrix}. \quad (2)$$

The parameter h is given by:

$$h = \sqrt{\frac{1}{2} \frac{a^2}{\Delta}}, \quad (3)$$

where α is the half-size of the GRIN waveguide for a single transverse mode, and $\Delta=(n_1-n_2)/n_1$.

The approximate value of α calculated by the known WKB method, is given by Yariv (see Yariv, A., *Optical Electronics*, 3rd ed., Holt, Rinehart and Winston, N.Y. (1985)):

$$a = \frac{2(l|l+2m+1)\lambda}{2\pi n_1(n_1^2 - n_2^2)^{1/2}}. \quad (4)$$

For a single mode, where mode m=0, length l=1, and wavelength λ=1.55 μm, and a typical GRIN with refractive indices $n_1$=3.55 and $n_2$=3.45, yields α=1.18 μm and h=4.97 μm.

Clearly, there are many other choices of ($n_1$, $n_2$) (see FIG. 3) for building a GRIN using lattice matched as well as strained III-V compounds. However, the inventors have designed a GRIN to show the sensitive behavior of the Gaussian beam to the choice of (l, d).

For a stable, low loss optical oscillation, we require for the Gaussian beam, $$\left| \frac{1}{2} (A+D) \right| < 1, \quad (5)$$

where A,D are defined by Equation (1), and for low diffraction loss due to a finite-sized waveguide:

$$w = \left( \frac{\lambda}{\pi n} \right)^{1/2} \frac{B^{1/2}}{[1 - 1/4(A+D)^2]} < \rho\lambda \quad (6)$$

where ρ is a parameter related to the total thickness of the laser structure. A typical value of ρ=1.

The condition of Equation 5 guarantees a finite optical beam size, and the condition of Equation 6 eliminates the diffraction loss due to a waveguide of finite size. This is so since typical laser structures (waveguide portion) have a total epi-growth thickness of, for example, about 1–3 μm, thus maximum beam spot size in the waveguide must not exceed this value. As a numerical example, consider a hypothetical 1.55 μm SQW GRINSCH laser. (In practice, there are many possible ways to grow lattice matched, or strained 1.55 μm lasers. The procedure for analyzing a 1.3 μm SQW GRIN-SCH laser, is identical, and is therefore not repeated.) The value of h here is 5 μm, assuming $n_1$=3.55, $n_2$=3.45, α=1.18 μm; and the transparent filing section is semi-insulating material with a refractive index of n=3.45. Choosing the reference plane as shown in FIG. 4, we can estimate the spot size of the Gaussian beam, and evaluate the stability requirement.

Figure 5:
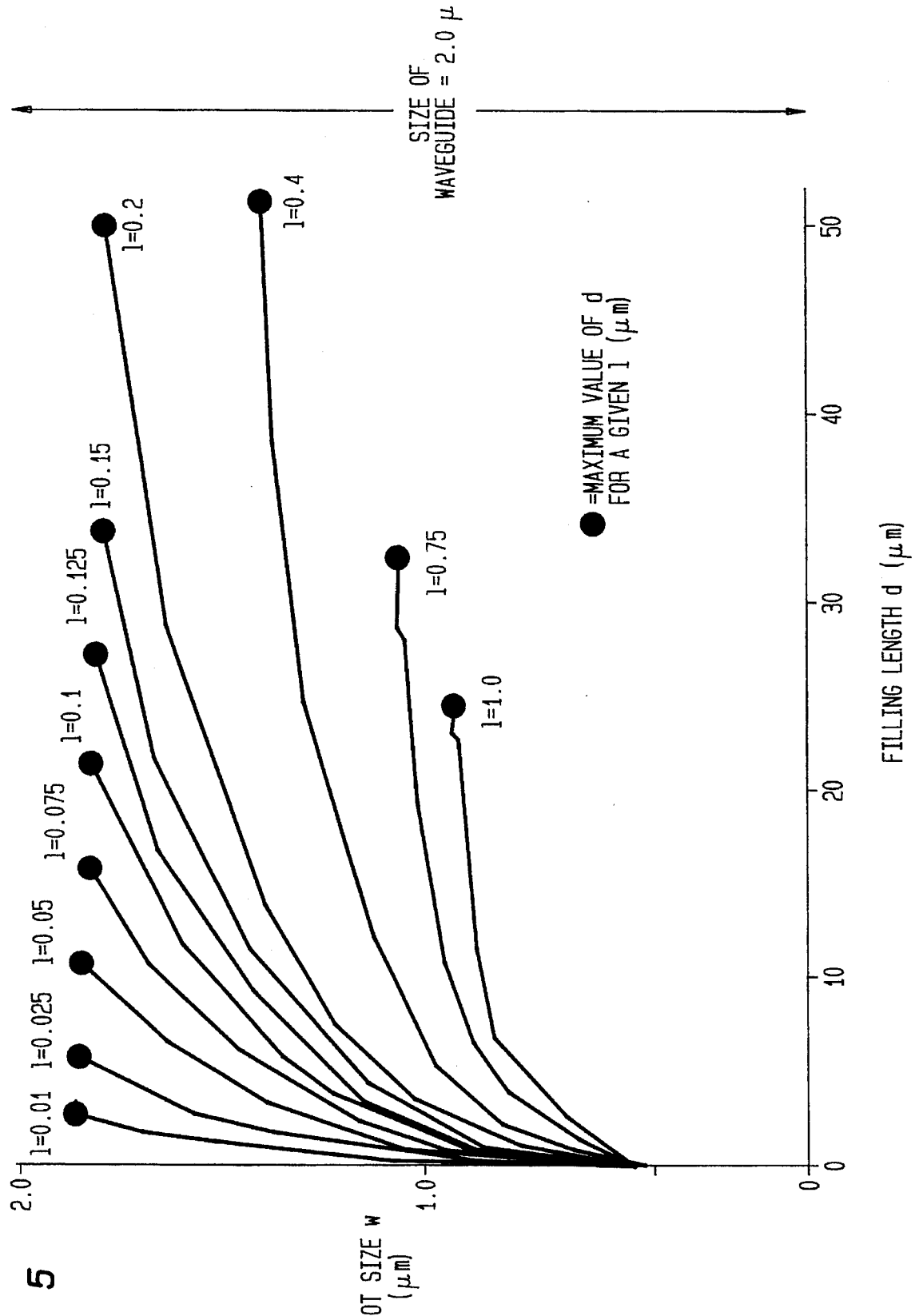
FIG. 5 shows optical beam spot size, w, as a function of non-guiding insulator length, d, for an MTL, according to the present invention.
Figure 6:
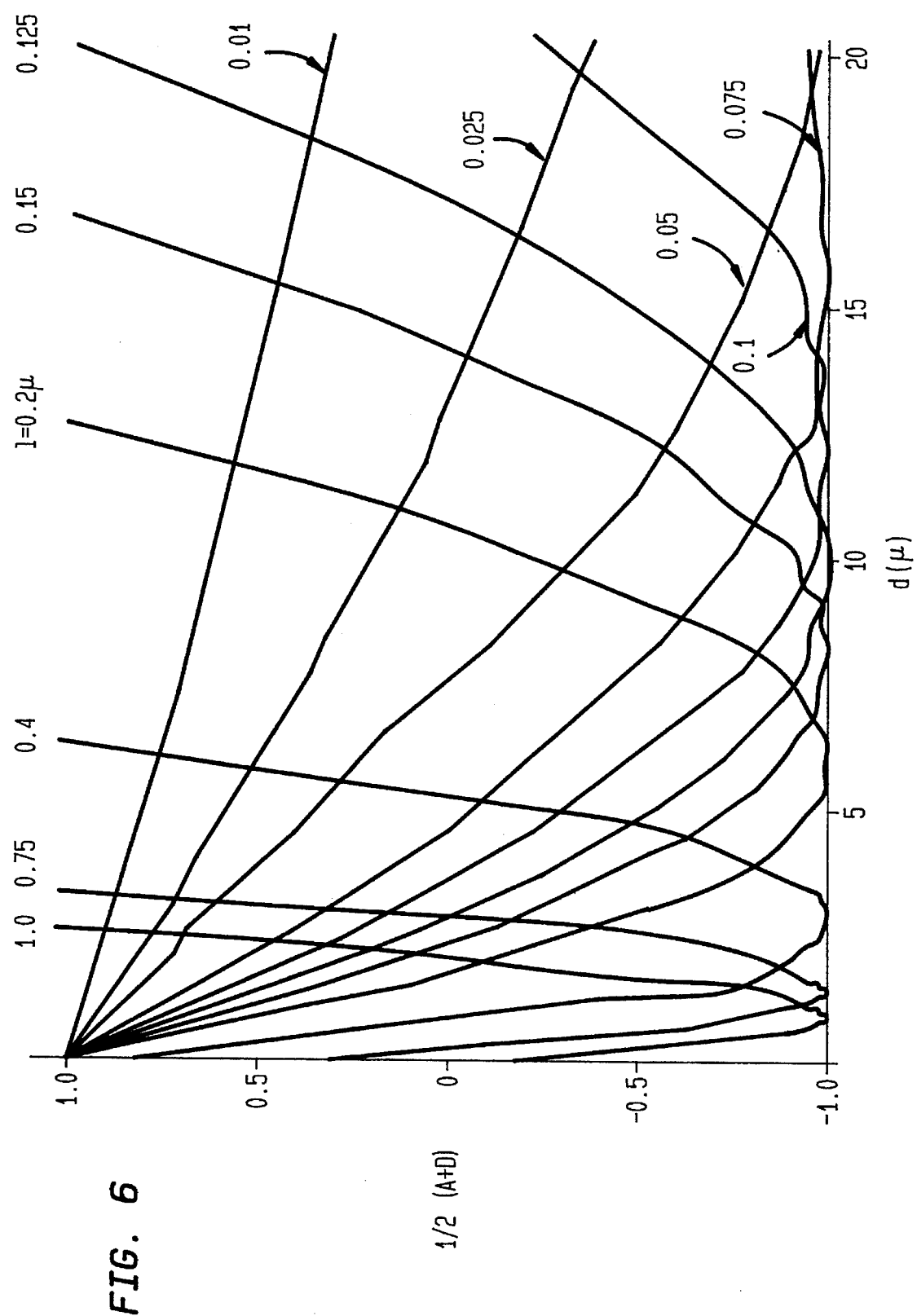
FIG. 6 shows resonator stability parameter, $|½(A+D)|$, as a function of, d, for an MTL, according to the present invention.

The beam spot size w vs. d for different values of l is plotted in FIG. 5, and the value of |½(A+D)| vs. d for different values of l is plotted in FIG. 6. The inventor's goal was to find the maximum value of d/l for which both the stability and the low diffraction loss requirement are met.

Figure 9:
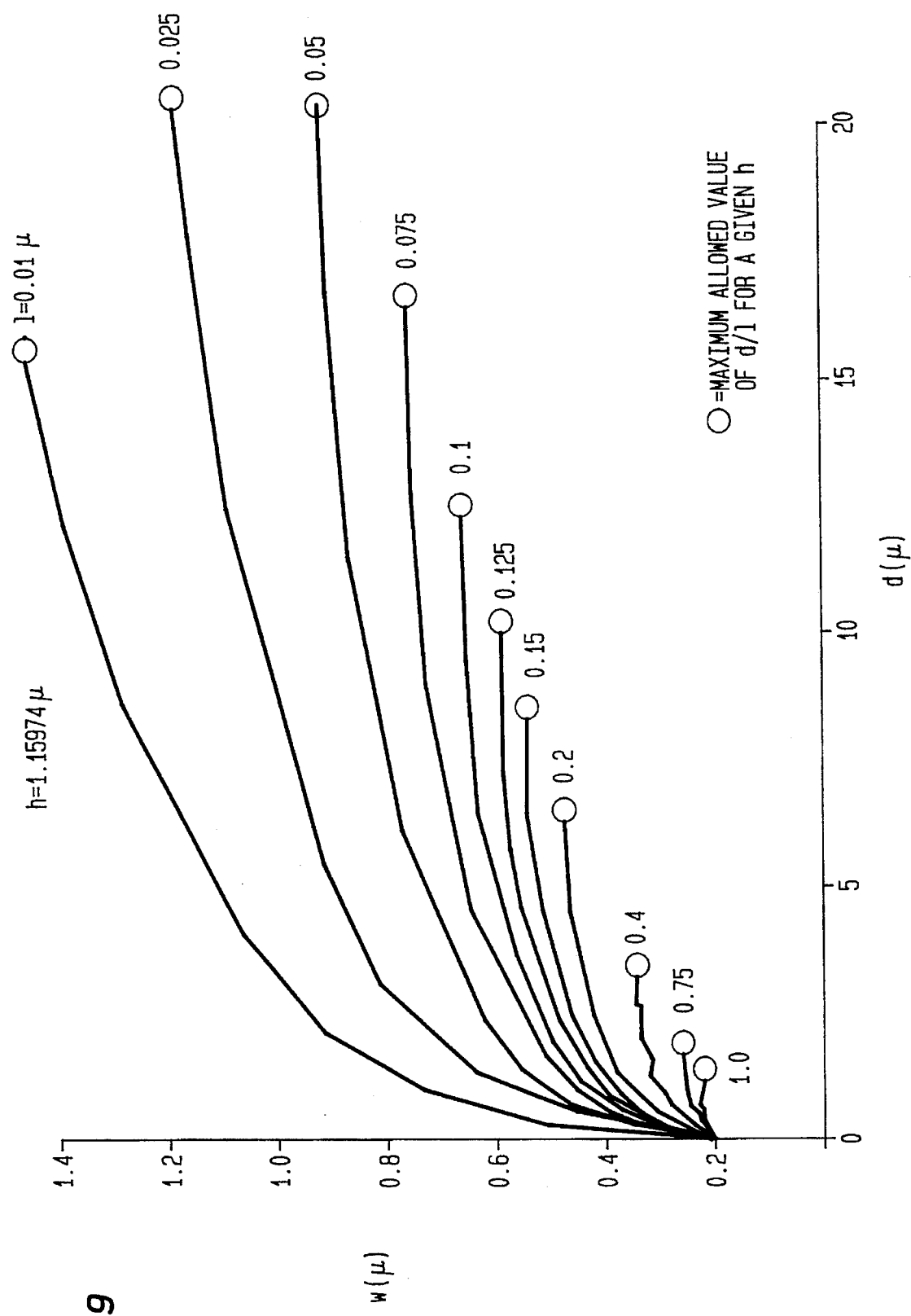
FIG. 9 shows for a given h (in n(r), see FIG. 3), the maximum value of allowed d/l ratio, according to the present invention.

From FIGS. 5 and 6, clearly when l is too small (e.g., l=0.01 μm), the spot size w will exceed the allowed 2 μm, failing the low loss requirement; it is also clear that a large l, e.g., l=1 μm, will fail the stability requirement. For example, for l=0.01 μm, to obtain a 2.0 μm spot size, d has to be less than 2 μm. If l=1 μm, then the stability requirement is violated, as shown in FIG. 6, at d>24 μm. Obviously, not all values of (l, d) combination can satisfy the two requirements. FIG. 9 shows for a given h(in n(r), see FIG. 3), the maximum value of allowed d/l ratio, according to the present invention.

Consider a 250 μm long cavity (this is the shortest cavity length due to a cleaving aspect ratio of 1 to 4 between the thickness and the length of a wafer; the procedure for analyzing longer cavities is the same and is therefore not repeated) used to build a minimum threshold laser structure, there are more than one active GRIN section. The specific number of GRIN sections and the optimum integrated GRIN length, are the subject of discussion in Section IV.

The inventors selected a structure with the largest value for d/l to obtain the lowest possible total active volume. Thus, the total cavity length L for plural GRIN sections is:

$$L = \Sigma l + \Sigma d, \quad (7)$$

and the active volume reduction factor γ, assuming the same x,y dimensions, is given by:

$$\gamma = \frac{V_{act}}{V^0_{act}} = \frac{L}{\Sigma l} = 1 + \frac{\Sigma d}{\Sigma l}, \quad (8)$$

where $V_{act}$ is the total active volume of a full cavity length pumped laser, and $V^0_{act}$ is the total active volume of the GRINSCH section in a binary stratified structure.

The next section addresses (1) how to decide which (l, d) to use to construct a MTL in practice, (2) what are the issues involved in building an operational MTL, and (3) how to balance the practical concerns.

IV. Packaging and Reliability

Although from FIGS. 5 and 6 it seems possible to build a low threshold laser with a variety of choices, in practice, however, one must be concerned with other problems such as the metal migration caused by an excessively high current density and the difficulty in heat removal, which can seriously reduce the reliability of a MTL, and render whatever gain that might have been obtained from threshold current reduction irrelevant and inconsequential.

A. Operating Power Level

For typical communication applications requiring several mW of optical output power, even with 100% (50% is more typical) conversion, more than 1 mA of current has to be pumped through the laser. With a typical junction voltage drop of more than 2 volts, more than 2 mW of electrical power is pumped into the active region.

B. Electromigration

To reduce threshold current, the area of the quantum well normal to the current flow, $A_{Qw}$, should be made as small as possible. On the other hand, the current density level at which a 1 mW optical output power is obtained, must not exceed the critical value for electromigration, alias, metal migration. For example, if the total area of cross-section is 1 μm, and the total input current is more than 1 mA, then the current density through the metal contact is greater than $10^5$ A/cm$^2$, which is the typical value for onset of electromigration. (See Mead and Conway, *Introduction to VLSI Systems*, Addison-Wesley, Reading, Mass. (1980).) Therefore, the inventors require the total cross-section area, $A_{Qw}=l_y \times \Sigma l$, to satisfy the following condition:

$$A_{QW} \geq \frac{I_{th}}{j_{migration}}, \quad (9)$$

where $l_y$ is the width of the GRIN in y direction, $j_{migration}$ is the critical value of electromigration for the particular metal used, and $\Sigma l$ is the minimum length of the active GRINSCH section corresponding to a beam spot size not exceeding the size of the waveguide (total epitaxial layer thickness).

This requirement will reduce the active volume reduction factor, γ, by an amount depending on the design. For example, γ=25 in a 250 μm long cavity, if a total of ten (l=1 μm, d=12 μm) sections are used, which corresponds to pumping 4% of the cavity. If we further choose $l_y$=1 μm, then the total area is $A_{Qw}$=10 μm$^2$, which is well within the metal migration limit of about 1 μm$^2$. Our choice of N=10 sections is motivated by the ease of etching 1 μm×1 μm mesas using existing technology.

C Thermal Management

The most important factor that can help decide the optimal value of $A_{Qw}$, however, is that of thermal management. Ideally, as has been shown by its success in advanced electronic packaging, the process of solder reflow bonding, otherwise known as flip-chip bonding, should be used to provide both electrical and thermal interface between the laser and outside world. (See K. L. Tai, Proceedings of *Multichip Module Workshop*, IEEE Computer Society, Santa Cruz, Calif. (1991).) Considering: (1) the Joule heating generated by laser's ohmic resistance in the area $A_{Qw}$, and (2) the carrier heating generated by absorption of spontaneous and non-radiative combination in an area somewhat larger than $A_{Qw}$, and assuming, conservatively, for a typical application requiring more than 1 mW of optical power, that 1 mW of heat is generated entirely in the active region $A_{Qw}$, we must require that:

$$H_{sink} = \kappa_s \Delta T \times \frac{A_{QW}}{h_s} \geq 1 mW, \quad (10)$$

where the solder area is the same as $A_{Qw}$, height $h_s$, thermal conductivity $\kappa_s$, and the temperature difference across the solder is $\Delta T$.

For example, the total amount of heat removable, if a high capacity heat bath such as diamond is used, by a typical lead-tin solder with $\kappa_s \approx 0.38$ W/cm-K (watts per centimeter-degree Kelvin), $h_s \approx 2$ μm, and $A_{Qw}$ of 1 μm$^2$, is $H_{sink}$=19× ΔTμW. To withdraw 1 mW of heat in $A_{Qw}$=1 μm$^2$, a temperature rise of 52° C. has to be tolerated, which is certainly unacceptable. If the junction temperature rise is restricted to 5° C., then the area has to be increased to $A_{Qw}$=10 μm$^2$.

For the previous example of (l=1 μm, d=12 μm, $l_y$=1 μm), this would mean that a total cross-section of $A_{Qw}$=10 μm$^2$ is the absolute minimum for removing 1 mW of heat. A more redundant design will increase $A_{Qw}$ further. The active volume reduction factor of 25 represents one possible (there are other choices depending on the application) compromise between x and y dimensions of $A_{Qw}$, for a constant $A_{Qw}$.

The preceding analysis shows that thermal management places the utmost stringent requirement on laser design and requires a much larger quantum well area that we would like. Second in importance, is the electromigration concern, which is not as serious as thermal management. The third requirement of optical stability, which provides for a range of possible (l, d) combinations, does not impose an area requirement that is comparable to the first two, and it will certainly be overshadowed by the thermal as well as the electromigration concerns.

The practical total area requirement on $A_{Qw}$ almost certainly requires periodic pumping more than one GRINSCH along the laser cavity. To design a suitable MTL for pumping, first, we use the optical stability requirement to find the allowed values for (l, d), both the electromigration and heat-sinking requirements must be evaluated to decide the total area $A_{Qw}$. The totals area will decide the value of $\Sigma l$ for a given $l_y$ based on single transverse mode considerations. The value of $\Sigma l$ will decide the number of GRINSCH sections in a cavity, using the maximum allowed value of d/l in the set of (l, d). A simple trial-and-error approach should be sufficient to find the optimum combination of $(l_y, l, d)$ for which a MTL can be obtained.

D. Comparison with Quantum Wire, Box Lasers

Given that the total cross-section area $A_{Qw}$ must be a constant that is decided by thermal management requirement, the only possible design tradeoff is the one between the width $l_y$ and the integrated active length $\Sigma l$, whose product is the constant $A_{Qw}$. A quantum wire laser, is simply the extreme case where $l_y$=100 Å, and $\Sigma l$=L. (See Yi et al., *Appl. Phys. Lett.* 59:3015 (1991).) The universal heat-sinking requirement of $A_{Qw}$=10 μm$^2$ means that the total cavity length has to be more than 1,000 μm.

In comparison, to achieve the same low threshold current, in a MTL, the difficulty of fabricating a 100Å×1,000 μm active region (aspect ration=$10^5$), is replaced with a much easier task of etching, for example, N=10, 1 μm×1 μm mesas (aspect ratio=1). Although it is still debatable whether quantum wire lasers may benefit from addition quantum effects in one dimension, the ease with which a MTL can be built with existing technology cannot be over-emphasized.

A quantum box laser is another extreme case where l, $l_x$, and $l_y$ are all equal to 100 Å. (See Asada et al., *IEEE J. Quantum Electron*, QE-22:1915 (1986).) To obtain a total cross-section area of $A_{Qw}$=10 μm$^2$, a total of $10^5$ boxes are required. This is unrealistic. Instead, our approach of, for example, using a total of 10 l=1 μm, d=12 μm, and $l_y$=1 μm SQW GRINSCH sections is more practical and manufacturable.

In summary, there are many important practical issues, besides the usual resonator stability and threshold requirements found in a traditional laser theory, which determine the laser performance in applications requiring mW optical power. These packaging related issues, to a large extent, have been ignored in traditional laser analysis. The inventors singled out two important effects (there are many more, for example, mechanical stability under thermal cycling), the metal migration caused by excessively high current density, and heat-sinking, to show how they affect the design of all low threshold and single mode semiconductor lasers using existing technology. The present invention also provides a systematic method of optimizing the laser resonator design to achieve the smallest active volume, which will result in the lowest possible threshold current, for a given manufacturing process.

V. Distributed Feedback Lasers

The binary stratified structure of the present invention is also ideally suited for distributed feedback (DFB) laser applications, since there is no need to design and fabricate a grating parallel to the wavelength. Such gratings have proven difficult in a manufacturing process and are responsible for the low yield in DFB laser production seen today.

For example, the coupling coefficient $\kappa$, of a DFB laser, is very sensitive to the actual fabrication process of the grating that contains many unknown and uncontrollable parameters. The difficulty will be greatly reduced if a binary stratified structure is used, because light in a periodically pumped binary stratified structure gets reflected at the boundaries by a normal incidence, instead of at a 90° angle.

A binary stratified structure is much easier to analyze theoretically: the reflections at the boundaries are caused by a first order effect characterized by $(n_2-n_1)^2/(n_2+n_1)^2$, $n_1$ and $n_2$ being the refractive indices of the two heterostructure layers, compared to the perturbation treatment required by a conventional DFB laser. It also benefits from a smaller active volume, compared to a full cavity pumped DFB, making it possible to achieve both low threshold current and single longitudinal mode at the same time. Furthermore, a binary stratified structure distributed feedback laser can be fabricated with fewer and simpler growth and processing steps: following the initial GRINSCH growth, only a single etching is required to achieve both low threshold and single mode requirements.

The behavior of a binary stratified structure is well-known. The ABCD matrix described in Section III (see Eq. 1) can be used to derive the new threshold condition for the DFB laser. For a Gaussian beam propagating in the z direction, the electric field is given by $$E(\vec{r},t) = A(\vec{r})\exp\left[i\left(\omega t - kz - \frac{kr^2}{2\rho}\right) - \frac{r^2}{w^2}\right], \quad (11)$$

where $A(\vec{r})$ is the complex amplitude of $E(\vec{r},t)$, $k=2\pi/\lambda$, $\rho$ and $w$ are the radius of curvature and the spot size of the Gaussian beam, respectively.

Using the complex radius of curvature q, $E(\vec{i},t)$ can be written as:

$$E(\vec{i},t) = A(\vec{i})\exp\left[i\left(\omega t - kz - \frac{kr^2}{2q}\right)\right], \quad (12)$$

where q is:

$$\frac{1}{q} = \frac{1}{\rho} - \frac{i\lambda}{\pi w^2}. \quad (13)$$

The threshold condition is obtained if the Gaussian field, after making a round trip, retains the same amplitude, and a phase differing by only multiples of $2\pi$. Let R be the ratio of the initial and final field, then for threshold, $$R = \frac{\exp\left[i\left(k0 - \frac{kr_0^2}{q_0}\right)\right]}{\exp\left[i\left(k2L - \frac{kr_0^2}{\frac{Aq_0+B}{Cq_0+D}}\right)\right]} = 1 \quad (14)$$

The threshold condition is broken into two equations given by $$\text{Re}(R)=1, \quad (15a)$$

and $$\text{Im}(R)=1, \quad (15b)$$

$r_0$ and $q_0$ are the initial values of r and q, and the propagation constant k is given by $$k = \frac{2\pi}{\lambda} = (k_r + ik_i)\Pi(z), \quad (16)$$

where $\pi(z)$ is the periodic function corresponding to the distribution of the binary stratified layer structure, with $\pi(z)=1$ when z is in the GRINSCH section and $\pi(z)=0$ when z is in the semi-insulating semiconductor section, and $k_r$ and $k_i$ are the change in k in the GRINSCH sections caused by current pumping.

The ABCD matrix is the product of all individual ABCD matrices involved in the round trip, $$\begin{bmatrix} A & B \\ C & D \end{bmatrix} = M_{roundtrip} = M_{mirror} \times \ldots M_{fill} \times M_{GRIN} \times M_{fill} \times M_{mirror} \times \ldots \quad (17)$$

Since the plane mirrors do not change the beam spot size and the beam radium, the analysis presented in Section III is still valid. The same critical current density and heat-sinking requirements discussed in Section IV also apply here.

The N sections of GRINSCH-semi-insulator pair have a period of $$\Lambda = \frac{\lambda}{2n} l, \, l=1, 2, 3, \ldots \quad (18)$$

For a 1.55 μm DFB, in the first order, $\Lambda$ will be 2246 Å. A simple arrangement of l=0.1 μm and 2d=0.1246 μm will satisfy the Bragg condition. Even in this design, the total active volume is reduced by more than 50%, which will translate into a reduction in the threshold current of about the same amount.

Figure 7:
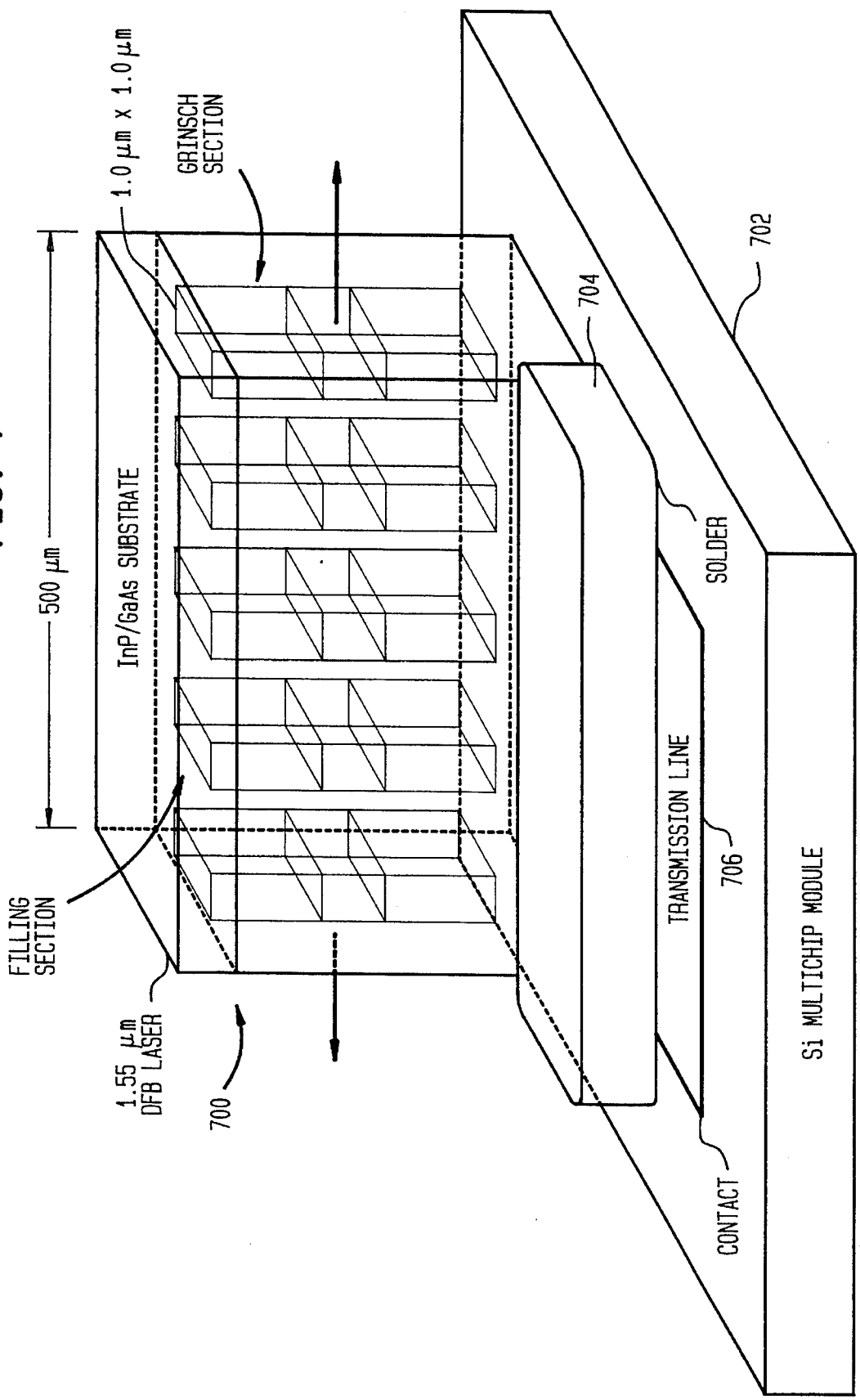
FIG. 7 shows the packaging of a MTL/DFB laser with a solder bump in a Si-substrate multichip module, according to the present invention.

A simple packaging scheme using the solder reflow technique is shown in FIG. 7. The laser chip 700 can be flip-placed on the Si (silicon) substrate multichip module 702. A solder strip 704 acts as an electrical, thermal, and mechanical contact to a transmission line 706.

VI. Conclusion

There are four valuable lessons learned in the past 20 years in making a reliable, low threshold semiconductor laser: (1) always build stable, low loss optical resonator, (2) reduce the volume of active medium as much as possible, (3) limit the current density to avoid metal migration, and (4) provide adequate heat-sinking. In practice, all four lessons are important and must be applied to the design, material growth, device processing, and packaging of a semiconductor laser.

Taking into account the practical operating requirement and reliability requirements, the inventors found that thermal management is by far the most serious problem affecting the design of a MTL. To alleviate this problem, a large area of active material is necessary, and this practically sets the lower limit on the threshold current, and puts the active volume reduction factor $\gamma$ at roughly 25 for a 250 μm long laser. Second on the list is the high operating current density that causes metal migration. It also requires a somewhat larger area of cross-section to spread the input current, and it puts the total area requirement at $A_{Qw}=1$ μm², a factor of 10 less than for heat-sinking. The third requirement, which ensures a stable, low loss Gaussian beam oscillation in the cavity, provides for a range of (l, d) combinations, from which an appropriate selection can be made.

The main advantage of a MTL over a quantum wire laser is that the difficult task of fabricating a 100 Å wide full cavity length active stripe, is replaced with a much easier task of building discrete active GRINSCH sections with a much easier to handle aspect ratio. The MTL that is discretely pumped by GRINSCH sections have the same total cross-section area $A_{Qw}$, and therefore, the same active volume for a given quantum well thickness, and it should have the same low threshold current.

The thermal management limited MTL also presents an easy task for fabrication. Existing state-of-the-an reactive ion etching techniques, for example, are capable of producing 1 μm×1 μm mesas on a routine basis. The crystal regrowth technique that can handle a stripe as narrow as 1 μm, can easily be adopted to make such MTLs. Even the existing surface-emitting lasers bear many characteristics of a MTL, and they can provide an excellent environment for studying the future of all minimum threshold semiconductor lasers with discrete active sections.

The spatially separated active sections can be used for studying the dynamic nature of a semiconductor laser. For example, the active section can be pumped separately for mode-locking applications.

The binary stratified structure is also an ideal candidate for future DFB lasers. The inherently simple device structure, which requires fewer and simpler processing steps, eliminates many unknown and uncontrollable parameters in a typical manufacturing environment. The existing multi-chip module packaging technology can also provide the best possible electrical, thermal, and mechanical environment for DFB lasers built with periodically active sections.

While various embodiments of the present invention have been described above, it should be understood that they have been presented by way of example, and not limitation. It will be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents. All cited patent documents and publications in the above description are incorporated herein by reference.

What is claimed is:

1. A graded-index, separate confinement heterostructure laser, comprising:

a substrate; and a binary stratified structure along an axis of an optical path upon said substrate, wherein said binary stratified structure comprises an active region of the laser, and includes at least two graded-index, separate confinement heterostructure (GRINSCH) sections upon said substrate; and at least three filler sections upon said substrate and sandwiching said at least two GRINSCH sections in an alternating fashion.

2. The laser according to claim 1, wherein said active region is electrically pumped.

3. The laser according to claim 1, wherein said substrate comprises a semiconductor.

4. The laser according to claim 3, wherein said semiconductor is a Group III-V material.

5. The laser according to claim 4, wherein said semiconductor includes one or more alloys comprising elements from a group consisting of Al, As, Ga, In, and P.

6. The laser according to claim 1, each GRINSCH section comprises a quadratic refractive index waveguide.

* * * * *